(12) United States Patent
Bernstein et al.

(10) Patent No.: US 7,700,410 B2
(45) Date of Patent: Apr. 20, 2010

(54) CHIP-IN-SLOT INTERCONNECT FOR 3D CHIP STACKS

(75) Inventors: Kerry Bernstein, Underhill Center, VT (US); Timothy J. Dalton, Ridgefield, CT (US); Edmund J. Sprogis, Underhill, VT (US); Anthony K. Stamper, Williston, VT (US); Richard Q. Williams, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 294 days.

(21) Appl. No.: 11/759,651

(22) Filed: Jun. 7, 2007

(65) Prior Publication Data

US 2008/0303139 A1      Dec. 11, 2008

(51) Int. Cl.
*H01L 21/44* (2006.01)
(52) U.S. Cl. .................. 438/109; 438/113; 438/114; 257/E21.596; 257/E21.599
(58) Field of Classification Search .................. 438/109, 438/113, 114; 257/E21.596, E21.599
See application file for complete search history.

(56) References Cited

U.S. PATENT DOCUMENTS

| | | | |
|---|---|---|---|
| 4,922,378 A | 5/1990 | Malhi et al. | |
| 5,031,072 A | 7/1991 | Malhi et al. | |
| 5,397,747 A | 3/1995 | Angiulli et al. | |
| 5,646,067 A * | 7/1997 | Gaul | 438/458 |
| 6,156,165 A | 12/2000 | Pierson et al. | |
| 7,432,604 B2 * | 10/2008 | Farnworth et al. | 257/792 |
| 2008/0111253 A1 * | 5/2008 | Salzman | 257/786 |

* cited by examiner

*Primary Examiner*—Charles D Garber
*Assistant Examiner*—Stanetta D Isaac
(74) *Attorney, Agent, or Firm*—Scully, Scott, Murphy & Presser, P.C.

(57) ABSTRACT

A chip-in-slot interconnect for three-dimensional semiconductor chip stacks, and particularly having the ability of forming edge connections on semiconductor chips, wherein the semiconductor chips are mounted in one or more chip carriers which are capable of being equipped with embedded circuitry. Moreover, provision is made for unique methods for producing the edge connections on the semiconductor chips, for creating a semiconductor chip carrier, and for producing a novel semiconductor and combined chip carrier structure.

8 Claims, 11 Drawing Sheets

CHIP-IN-SLOT INTERCONNECT FOR 3D CHIP STACKS

BACKGROUND OF THE INVENTION

1. Field of the Invention

This present invention relates to the provision of a chip-in-slot interconnect for three-dimensional semiconductor chip stacks, and particularly the ability of forming edge connections on semiconductor chips, wherein the semiconductor chips are mounted in one or more chip carriers which are capable of being equipped with embedded circuitry. Moreover, the invention is directed to the provision of unique methods for producing the edge connections on the semiconductor chips, for creating a semiconductor chip carrier, and for producing a novel semiconductor and combined chip carrier structure.

2. Discussion of the Prior Art

In the present state-of-the-art, methods are employed which facilitate the formation of a three-dimensional interconnect of multiple semiconductor die in order to be able to provide an enhanced performance, and to be able to reduce costs and excessive spending in leading-edge technology trends. At this time, various techniques are applied in order to be able to produce the closest proximity of circuitry on dissimilar or differently sized semiconductor chips, in order to thereby facilitate high performance interconnections, such as for processors and memories. In this connection, it is an aspect of the technology that three-dimensional semiconductor chips are fabricated through the use of packaging technology, such as wire bond die stacks, flip-chip stacks or combinations thereof; through the provision of through-silicon vias, wafer to wafer interconnects by means of wafer bonding; die-to-die interconnects by bump bonding or combinations thereof; and multiple die which are laminated into cubes with patterned interconnects located primarily along one or a single cube face.

However all of the foregoing methods currently employed are subject to drawbacks and limitations in the provision of methods and products, which facilitate the fabrication of edge connections for multi-level or three-dimensional semiconductor chips.

Pierson, et al., U.S. Pat. No. 6,156,165 disclose edge connections on integrated circuits or semiconductor chips, which extend along the length of the semiconductor chip edge. However, this disclosure is limited to primarily a method and fails to provide structure analogous to that claimed in the present invention. In this patent, chips with special edge connections are mounted on top of backplanes and may consist of a terminal wire or bond pad-like structure extending along the edge of a chip and a metalization or film which covers a terminal and bond pad by wrapping thereover along the entire edge of the chip and the surface below to some extent. This is a method of providing edge connections, which may be deemed unreliable in their utilization due to potential resistance, and electromigration issues potentially encountered at the corners of the wrapped around metalization and metal structure.

Angiulli, et al., U.S. Pat. No. 5,397,747, disclose a vertical chip mount memory package and method of producing therein semiconductor integrated circuit chips that are mounted directly on edge onto backplanes. Hereby, the edge connections depend on a dice cut through a solder ball which may be unreliable due to irregular solder ball cuts and also because of potential mechanical fatigue and high resistance and relying for the presence of solder, per se, in order to provide for the connections. Pursuant to the present invention, there is utilized an entirely different and repeatedly producible structure to provide for a connection which extends through the semiconductor or integrated circuit chip.

Malhi, et al., U.S. Pat. No. 5,031,072 and the continuation thereof, U.S. Pat. No. 5,031,072, describe primarily chip-in-slot in a backplane, an electrical connection being made to the semiconductor chips; however, which are not edge connections. The apparatus pursuant to the art utilizes topside connections and solder bridges to topside connections on a backplane, and has nothing in common with the present invention.

SUMMARY OF THE INVENTION

Accordingly, in order to clearly and unambiguously provide distinctions over the art and improvements in the technology, pursuant to the present invention there is described a chip edge contact structure, a receiving interconnect socket or carrier structure and a method of fabrication and assembly for both types of structures, which enables an improved overall range of physical application metrics over the prior art structures, as set forth in the above-cited publications.

In connection with the foregoing, pursuant to the present invention, there can be provided three-dimensional semiconductor chip stacks, whereby it is possible to provide for dissimilar sized die, in contrast with the three-dimensional cube approach pursuant to the prior art. Spacings are provided between the die, which are optimized for cooling purposes, and any encountered defective die can be simply removed and replaced. Furthermore, connections along multiple edges of the die are facilitated in order to provide for the highest interconnect density, and any through-via process complexity with a therewith associated loss of usable chip real estate is readily eliminated by means of the method and structure achieved by means of the present invention.

Concerning the foregoing, pursuant to the invention, utilizing three-dimensional semiconductor die stacks, there is achieved the best possible low-cost in comparison with that in the current state of the technology, inasmuch as the structure present herein is easier to rework, multiple embodiments are contemplateable, which can also be utilized for high velocity air cooling, and it is also capable of mixing different types of semiconductor chips in order to impart the highest degree of versatility to the invention.

Accordingly, pursuant to the present invention, there is applied a unique chip edge connection fabrication process in which, pursuant to a first method, the formed edge connectors are utilized subsequent to BEOL (back-end-of-line) fabrication in the overall interconnect structure.

In accordance with a modification of the fabrication process, a second method is directed to the forming of edge connectors during an early FEOL (front-end-of-line) manufacture sequence.

Moreover, the present invention also contemplates a basic chip carrier fabrication process, providing for chip carriers which may be passive or active in nature, by incorporating electronic circuitry in communication with the connectors on the chips, and which may also provide for operative connections with microprocessor and/or memory components.

It is, accordingly, an object of the present invention to provide a method of fabrication of three-dimensional semiconductor chip stacks possessing novel chip edge contact or interconnect structure.

Another object of the invention resides in the forming of a three-dimension chip stack with edge connect structure, in accordance with the novel fabrication process, as described herein.

A further object of the invention is to provide a chip carrier structure for inventively connecting the three-dimensional chip stack with a passive or active chip carrier.

BRIEF DESCRIPTION OF THE DRAWINGS

Reference may now be made to the following detailed description of preferred embodiments and aspects of the invention, taken in conjunction with the accompanying drawings; in which.

DETAILED DESCRIPTION OF THE PREFERRED EMBODIMENTS

Referring in specific detail to the inventive concept, which is directed to the provision of a semiconductor chip structure, which includes edge connections, as described in the drawings in specific detail, a first method of forming the edge connections in the semiconductor chip subsequent to a BEOL (back-end-of-line) interconnect structure formation is through a unique sequence of fabrication steps, as disclosed in FIGS. 1-14 of the drawings, representing a first method of fabrication.

As disclosed in the drawings, a semiconductor chip 10, which is to be provided with edge connections, may have a plurality of levels of circuitry 12 and transistors 14 arranged therein, as is well known in the technology, and may be adapted to be mounted in one or more chip carriers, which may also have embedded circuitry therein, as described hereinbelow.

Figure 1:
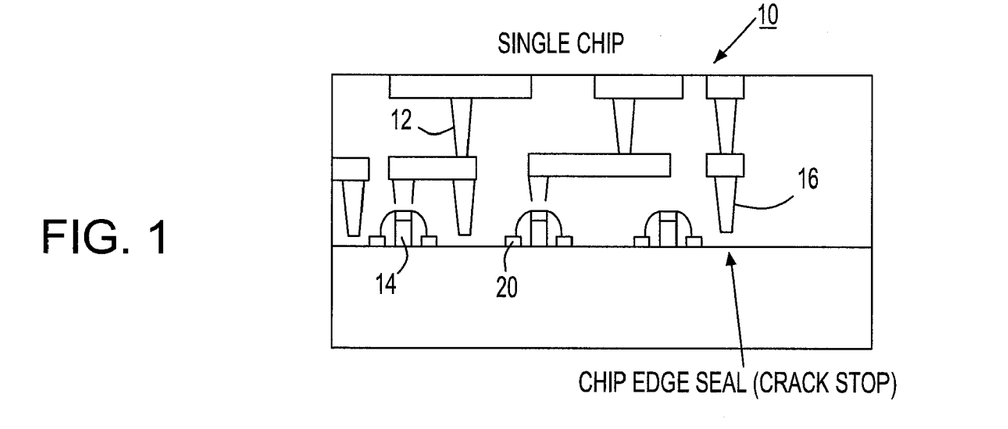
FIG. 1 illustrates generally diagrammatically, a cross-sectional view of a single chip structure in an initial stage of producing edge connections thereon pursuant to the present invention.
Figure 2:
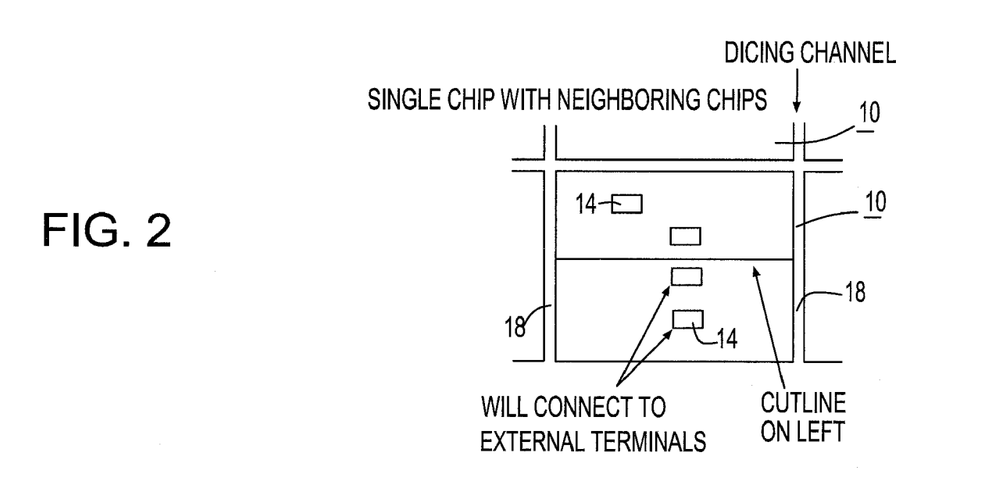
FIG. 2 illustrates a top plan view of the chip structure of FIG. 1, including adjoining further chips.

Pursuant to the invention, as described in FIGS. 1 and 2, wherein FIG. 1 illustrates a single semiconductor chip 10 showing multiple levels of electrical transistors 14 and interconnects 12, the chip is provided with an edge seal 16 in the form of a crack stop, as is well known in the technology.

Referring to the top view of the chip structure, with FIG. 2 showing the single chip 10 with adjacent further chips 10 and which are then separated from a wafer by means of suitable dicing along dicing channels 18, there may be provided electrical connectors to external terminals (not shown). As indicated in drawing FIGS. 1 and 2, an initial wafer structure representing a starting structure is processed, as is well-known, through the provision of a plurality of metal levels, wherein the last metal level 20 is adapted to connect to suitable edge connections which are to be produced pursuant to the present method. In this instance, the last metal level is the highest, or top-most metal level fabricated, whereby wiring is connected at top to the edge connectors.

Figure 3:
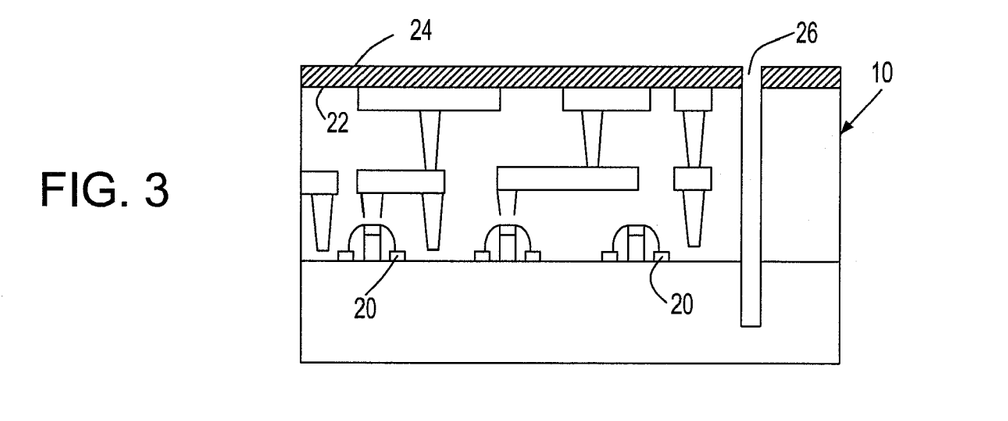
FIG. 3 illustrates a view similar to FIG. 1 showing further steps in forming the edge connections.

As indicated in FIG. 3 of the drawings, the upper surface 22 of the semiconductor chip 10 is imparted with a dielectric deposition layer 24 in the form of a mask for the formation of edge connectors and for lateral chip isolation, for example, through nitride. An anisotropic etch series of steps is adapted to provide holes through BEOL dielectrics and create a deep channel or trench, such as, for example, of 100 μm depth minimum in the substrate.

Figure 4:
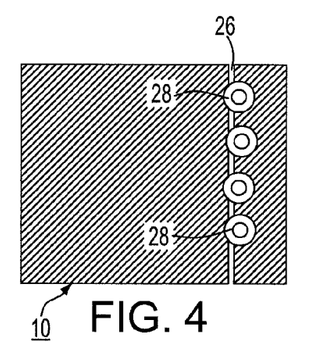
FIG. 4 illustrates generally diagrammatically, a top view thereof.
Figure 5:
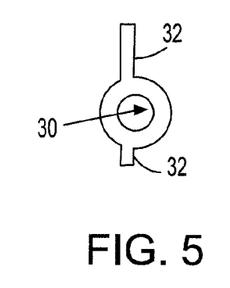
FIG. 5 illustrates, on an enlarged scale, a detail of an edge contact, which is employable in the chip structure of FIG. 4.

As also shown in FIG. 4 of the drawings, there is shown the channel 26 including a plurality of cylindrical trench portions 28, which may be equipped with suitable edge contacts in the form of circle 30, and having arm-like extensions 32, which are part of the original channel or trench, prior to the round or square contacts having been added, as in FIG. 5, which is an enlargement of FIG. 4, for the provision of electrical contact to the metal level 20, as described hereinbelow.

Figure 6:
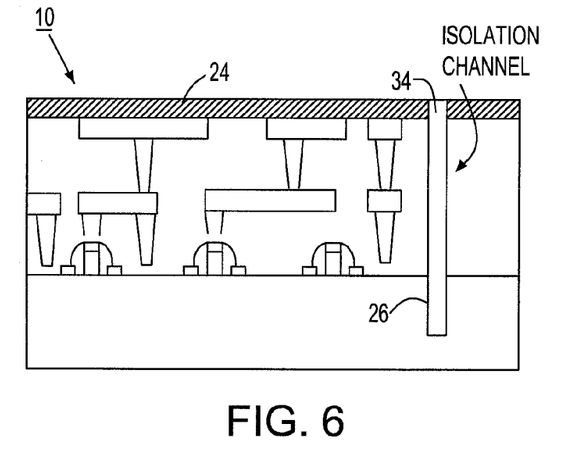
FIG. 6 illustrates the introduction of dielectric in a channel formed in the chip.
Figure 7:
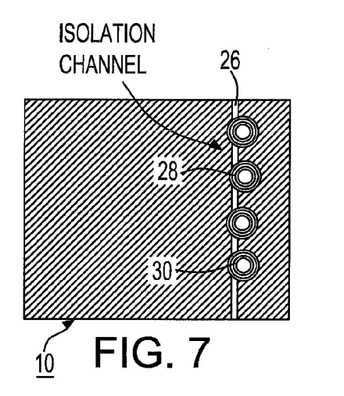
FIG. 7 illustrates, diagrammatically a top plan view of the chip of FIG. 6.

As indicated in FIGS. 6 and 7 of the drawings, a dielectric layer 34 is provided at the sides of the trench or isolation channel 26, so as to electrically isolate the connectors which are to be formed from the substrate, such as by CVD (chemical vapor deposition) with the inclusion of adequate material to create a 2 µm wide electrical isolation layer that, however, does not completely fill the channel or trench. However, as shown in FIG. 5, the thickness or width of the trench portion employed to form edge connectors is considerably larger, i.e., such as 5 µm for example, than the thickness or width of the trench that joins the edge connectors. This fulfills the purpose that when there is applied the dielectric, which fills the trenches, the joining portions are completely filled, whereas a cavity is left in the wider edge connector portion, which is subsequently filled with a conductive material. Another layer of a conductive material (metal, tungsten, polysilicon) may then fill the remainder of the trench or channel.

Figure 8:
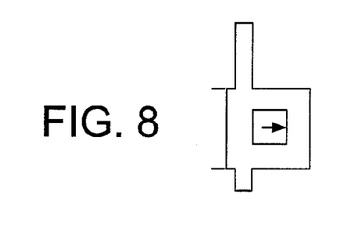
FIG. 8 illustrates an alternative edge contact configuration in comparison with that shown in FIG. 5.

The foregoing is indicated in the top view of FIG. 7, wherein the material 24 is shown located in the circular regions. Alternatively, rather than providing circular channel regions, as shown in FIGS. 4 and 5, these channel regions may be square or rectangular in nature to provide for the positioning therein of alternative edge contact structure 40, as shown in FIG. 8, the function and operative aspects of which are essentially identical to the circular configuration of the contact structure 30.

Figures 9, 10:
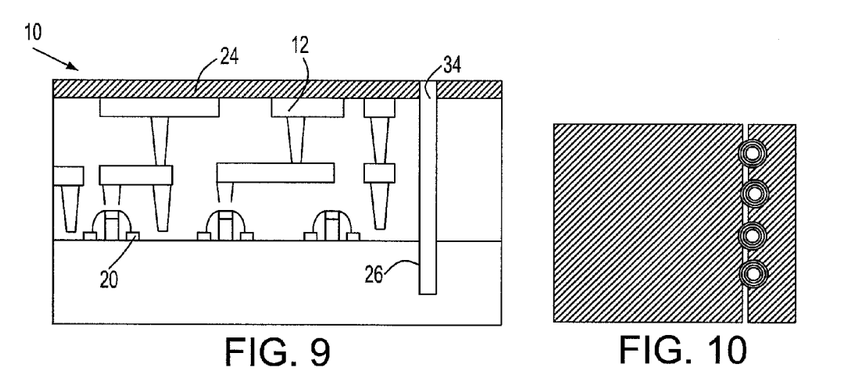
FIG. 9 illustrates the chip structure representation of the filling of the cavities in the edge connectors.
FIG. 10 illustrates a top plan view thereof in a diagrammatic representation.

Furthermore, as illustrated in FIGS. 9 and 10 of the drawings, the existing cavities may be filled in the edge connector channel regions with an electrically conductive material, such as tungsten or the like, and a planarization process is then effected to remove protruding excess conductive material.

Figure 11:
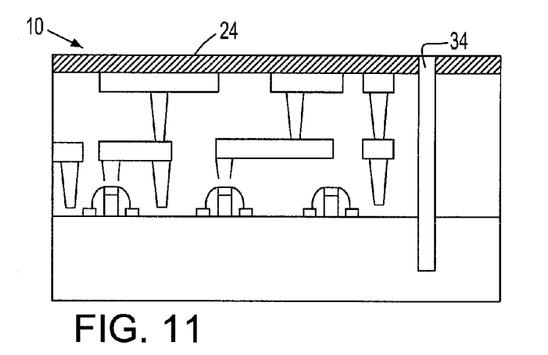
FIG. 11 illustrates a view similar to FIG. 9, showing open via holes and wiring to edge connectors in the chip structure.
Figure 12:
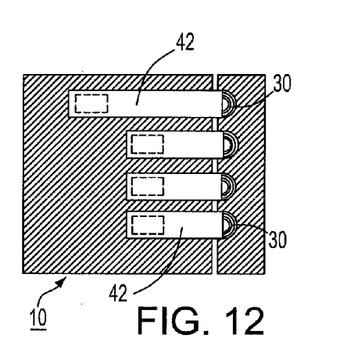
FIG. 12 illustrates, diagrammatically a top plan view of the structure of FIG. 11.

Thereafter, as shown in FIGS. 11 and 12 of the drawings, via holes are opened and wiring 42 is formed in order to contact the tops of the edge connectors between the various electrical wiring and contact components located within the lower metal level of the semiconductor chip 10, and as is also shown in FIG. 12.

Figures 13, 14:
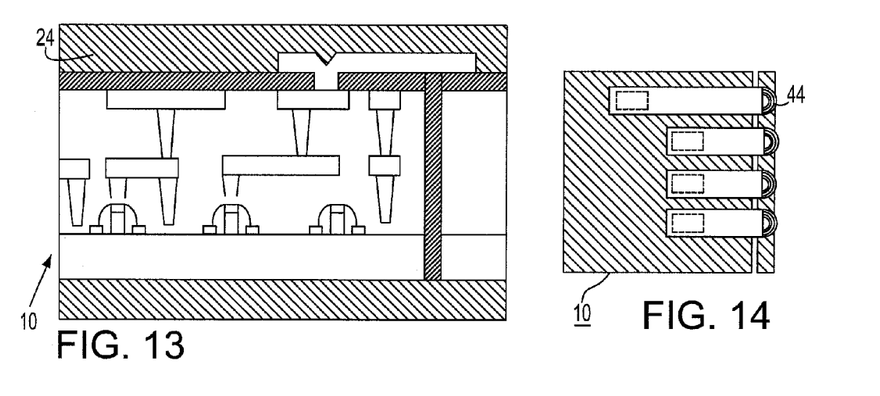
FIG. 13 illustrates edge connections in the chip structure in an exposed state.
FIG. 14 illustrates a top plan view of FIG. 13.

Thereafter, as indicated in FIGS. 13 and 14 of the drawings, the edge connections 44 are exposed by removing the material at the channel or trench, and the wafer forming the semiconductor chips 10 is thinned to the bottom of the edge conductor, and frontside and backside protective layers are applied, the chips 10 are then diced from the wafer, and silicon laterally etched back, and also dielectrics in order to expose the edge connections 44, as shown in FIG. 14 through the implementation of multiple etching steps. This, in effect, then provides the finish fabricated semiconductor chip 10, equipped with the suitable edge connections 44 in a simple and inexpensive manner, providing important advantages over the current state-of-the-art, which utilizes primarily known and more cumbersome cube technology. In this connection, the advantages obtained include easier reworking capabilities for multiple embodiments of different chip sizes and levels, the possibility of utilizing high-velocity air-cooling, and enabling different types of semiconductor chips to be employed and fabricated for various diverse installations and utilizations.

An alternative method of producing the semiconductor chip edge connections is illustrated in FIGS. 15 through 28 of the drawings, whereby in lieu of the BEOL process of fabrication employed in the first mentioned method, in this instance, there are employed fabrication steps during early FEOL (front-end-of-line) fabrication of the semiconductor circuitry and connections.

Figures 15, 16:
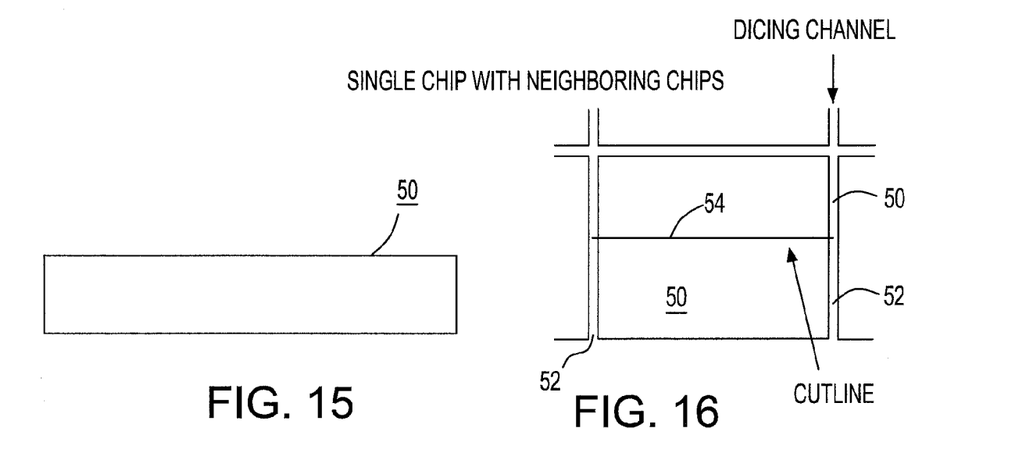
FIG. 15 illustrates an alternative chip structure employing a different method to form edge connectors in a side cross-sectional view of a single chip.
FIG. 16 illustrates a top plan view showing the chip structure with adjacent chips.

As indicated in FIGS. 15 and 16 of the drawings, the fabrication process is commenced with a wafer prior to devices being formed, preceding any pad nitriding.

As also indicated in FIG. 16, wherein the chip 50 is shown with adjacent chips and dicing channels 52, with a cut line 54 for producing the latter, this provides for an initial manufacturing step.

Figure 17:
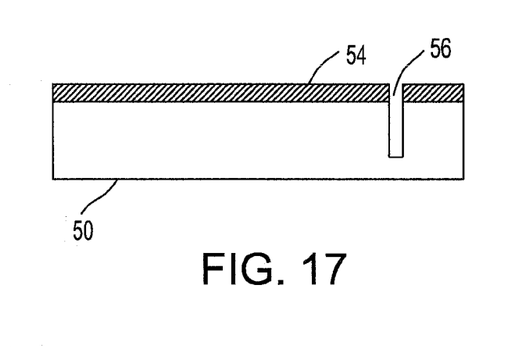
FIG. 17 illustrates the deposition of protective dielectric and the masking and etching of the chip of FIG. 15.
Figure 18:
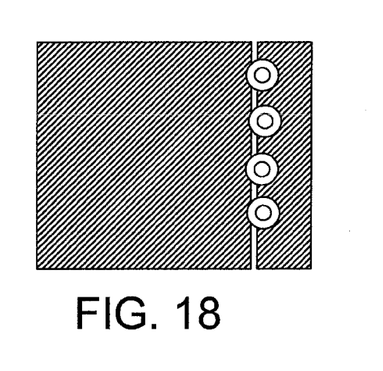
FIG. 18 illustrates a top plan view of FIG. 17 in a diagrammatic representation.

Herein, in FIGS. 17 and 18, there is indicated the deposition of a dielectric protective layer 54, for example, such as a nitride with the masking and etching of deep trench channel shapes 56 in the chip substrate, similar to the method described in connection with FIGS. 3 and 4.

The formed channel 56 may be equipped with electrical contact structures 30 or 40, similar to that as represented in FIG. 5 or 8 of the drawings, and no further detailed explanation is deemed to be required in that connection.

Figure 19:
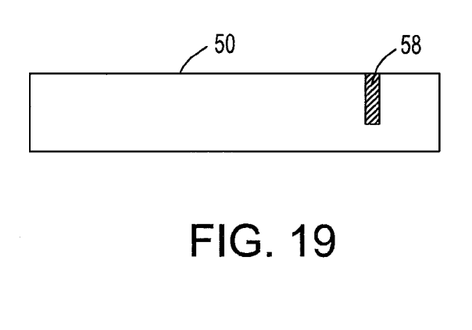
FIG. 19 illustrates the forming of an isolation dielectric to close off narrow channels in the chip of FIG. 15.
Figure 20:
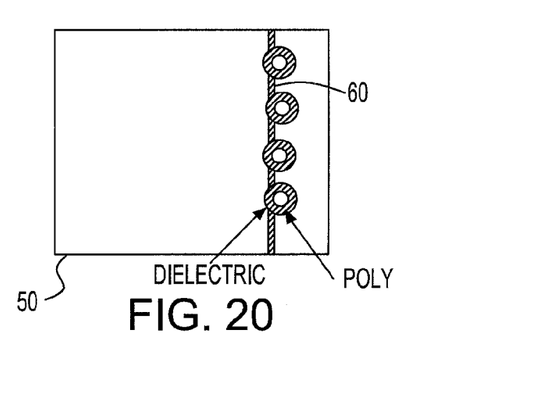
FIG. 20 illustrates a top plan view of FIG. 19.

Thereafter, as indicated in FIGS. 19 and 20 of the drawings, an isolating dielectric 58 is provided to cover the walls of the narrow channels and, for the remaining space, sacrificial polysilicon 60 is deposited therein as a temporary placeholder, whereupon the protective dielectric 58 is removed later on in the process, and the chip structure is thereafter planarized.

Figure 21:
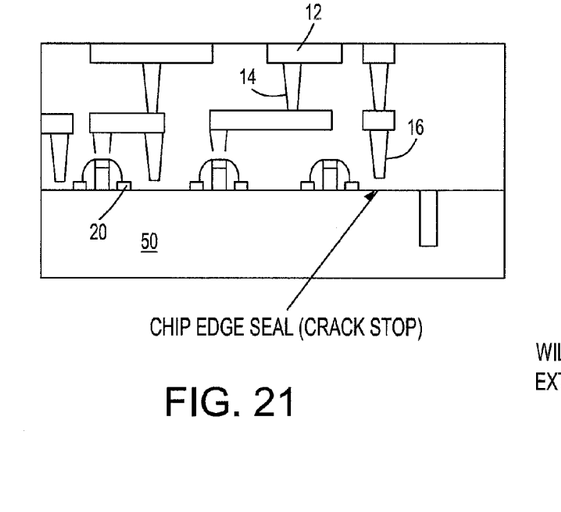
FIG. 21 illustrates a process in producing the chip edge seal structure for the chip of FIG. 15.
Figure 22:
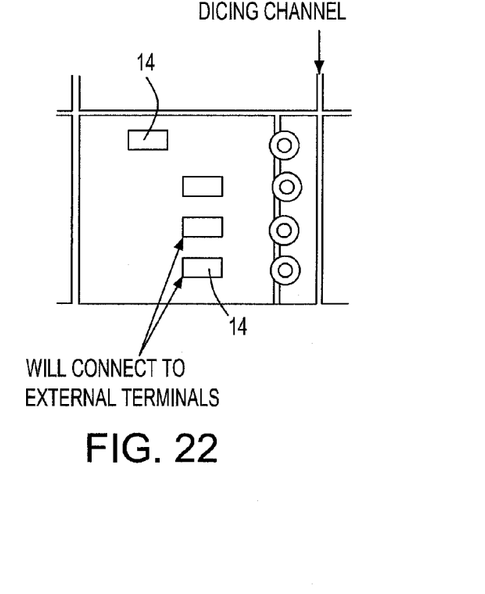
FIG. 22 illustrates a top plan view of FIG. 21.

As shown in FIGS. 21 and 22, the finish processing of the various levels leading to the last metal level is implemented in a manner, which is analogous to the first method, as represented in FIGS. 1 to 14.

Upon removal of the sacrificial polysilicon 60, the resultant cavity is then filled with a conductive material, i.e., such as metal or the like.

Figures 23, 24:
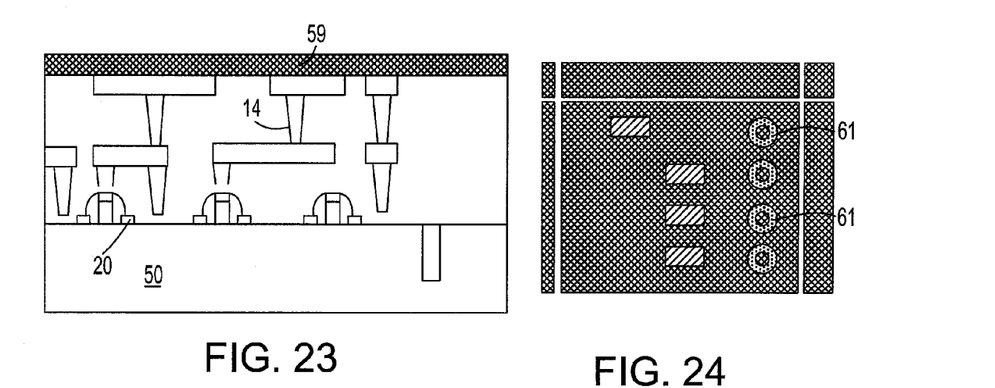
FIG. 23 illustrates the formation of an upper level dielectric for the chip structure.
FIG. 24 illustrates a top plan view of FIG. 23.

Thereafter, as represented in FIGS. 23 and 24, an upper level dielectric 59 is provided on the semiconductor chip 50, suitable masking/etching is implemented and a stud is 61 deposited in each of the respective channels so as to reach the edge connector.

Figure 25:
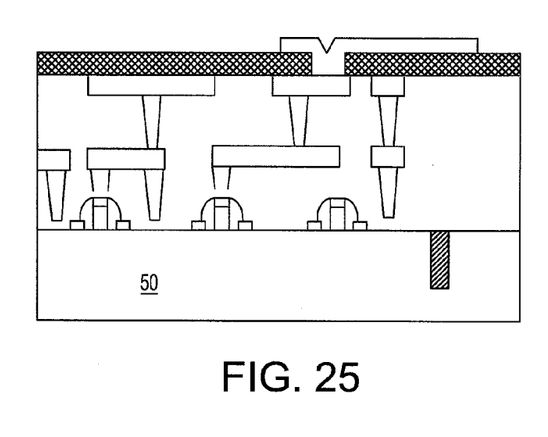
FIG. 25 illustrates the deposition of a masking layer and etching of the chip of FIG.
Figure 26:
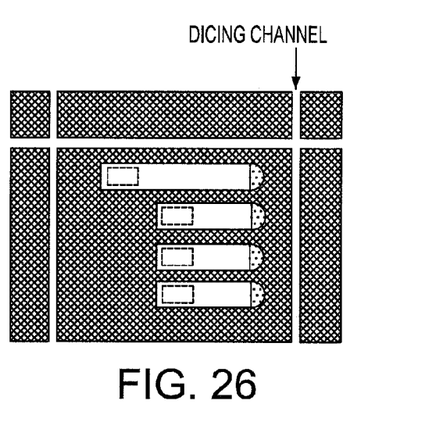
FIG. 26 illustrates a top plan view of FIG. 25.

As illustrated in FIGS. 25 and 26, thereafter the deposited masking layer is etched to produce for a connection to the last metal interconnect, and to provide a connecting channel between the etched connectors and the internal electronic components, which are located in the semiconductor chip.

Figure 27:
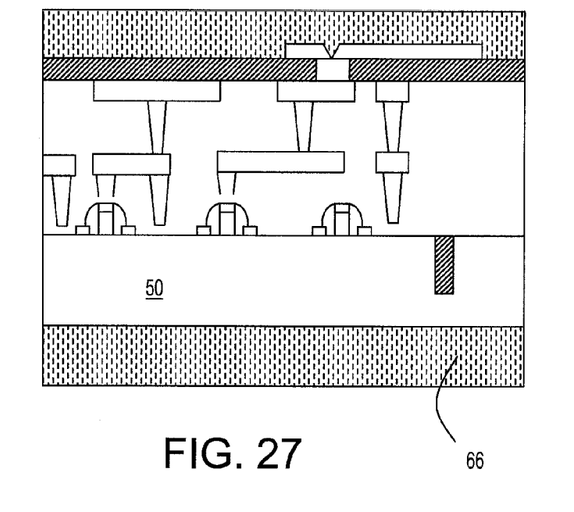
FIG. 27 illustrates a view similar to FIG. 25, showing the exposed edge connections on the chip.
Figure 28:
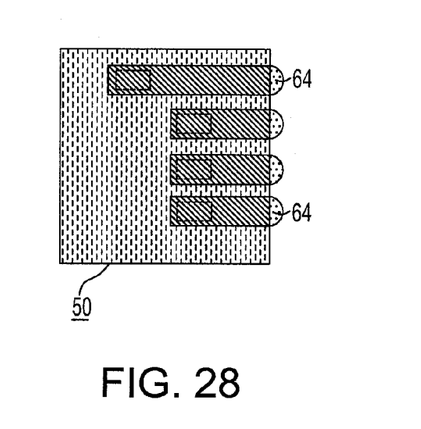
FIG. 28 illustrates a top plan view of FIG. 27.

Finally, as shown in FIGS. 27 and 28, the edge connections 64 are exposed by removing the material from the wafer or chip, and the latter is thinned to the bottom 66 of the edge connector by removing material, frontside and backside protective layers are applied, the semiconductor chip is diced from the wafer and silicon laterally etched back, and also the dielectrics, so as to expose the edge connections 64 in multiple etching steps, similar to the described first method. This then provides a structure, as illustrated in FIG. 28, which is essentially identical to that produced by the first fabrication method and represented in FIG. 14.

Figure 29:
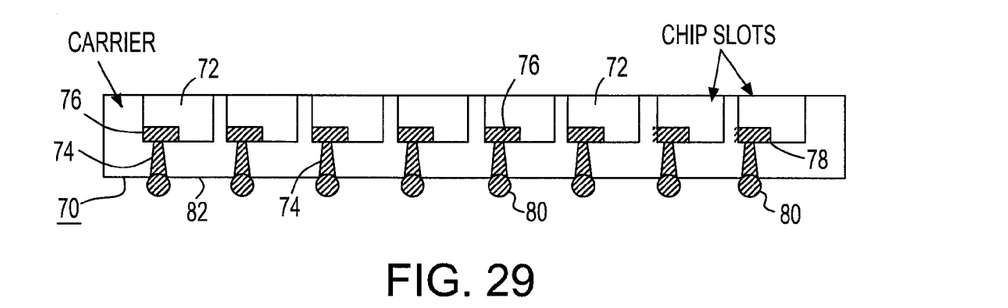
FIG. 29 illustrates, generally diagrammatically, a representation of a chip carrier formed by a basic fabrication process.

Referring to the concept of providing a carrier 70 for the semiconductor chips 10 or 50, as indicated in FIG. 29 in a diagrammatic representation, a carrier starting material might be a bare die, for example, silicon, a further chip, a rigid dielectric material, such as ceramic, or a printed circuit card.

In the carrier structure 70, there may be formed deep wide trenches 72, which are filled with sacrificial material, whereas on the opposite side, there may be drilled deep vias 74 stopping at the sacrificial material. The vias 74 are filled with a conductive material 76, whereas on the original side, these sacrificial materials are removed and terminal-wiring 78 is applied by utilizing conventional metal deposition techniques. C4 balls 80 forming connections may be provided on the backside 82 of the carrier structure 70 to form external connections, and solder applied in the trenches 72 to connect the chips 10 or 50 to the carrier. After the chips are mounted in the slots formed by the trenches, a low temperature thermal cycle may be imparted thereto so as to form permanent connections between the chips and the carrier.

Figure 30:
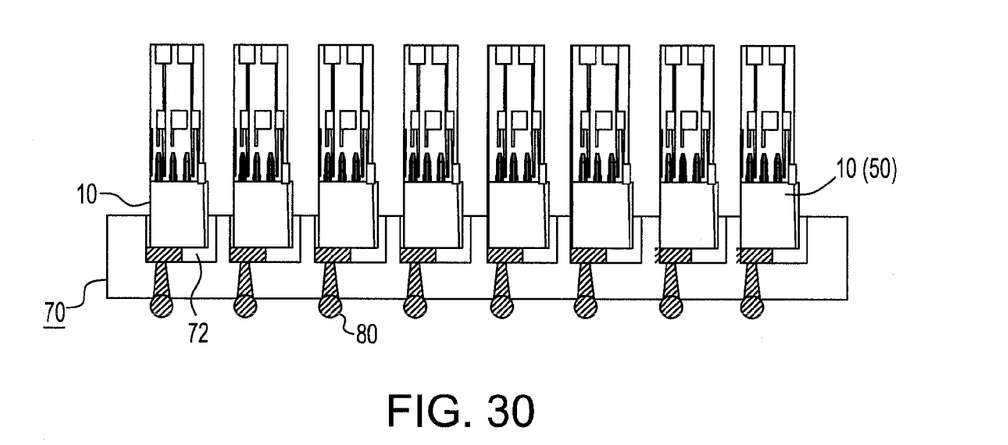
FIG. 30 illustrates a passive semiconductor chip carrier produced pursuant to the invention.

As illustrated in FIG. 30 of the drawings, the carrier 70 may be equipped with structural supports, and optionally, interconnects between the chips, such as a memory array, whereby the carrier can optionally contain bus terminations. Hereby, the chips may be of the type as produced by the preceding described methods, and bond pads may be provided in the sockets or trenches 72 formed in the carrier, so as to render the semiconductor chips 10 or 50 to be removable and replaceable.

Figure 31:
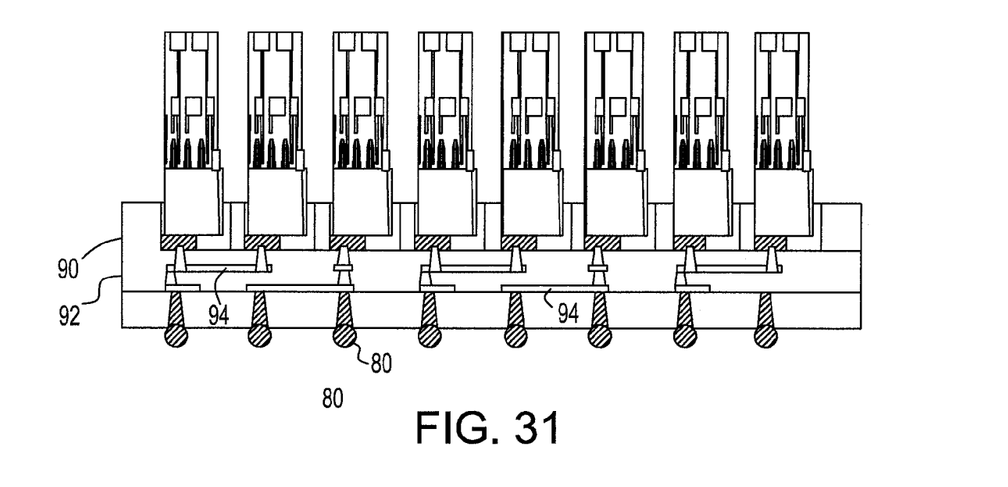
FIG. 31 illustrates an active chip carrier with wiring and active and passive circuitries.

As illustrated in FIG. 31 of the drawings, the chip carrier 90 may be equipped with a further layer 92 containing wiring and active and passive circuitry 94 with the remaining structure being analogous to the carrier 70 shown in FIG. 30.

Figure 32:
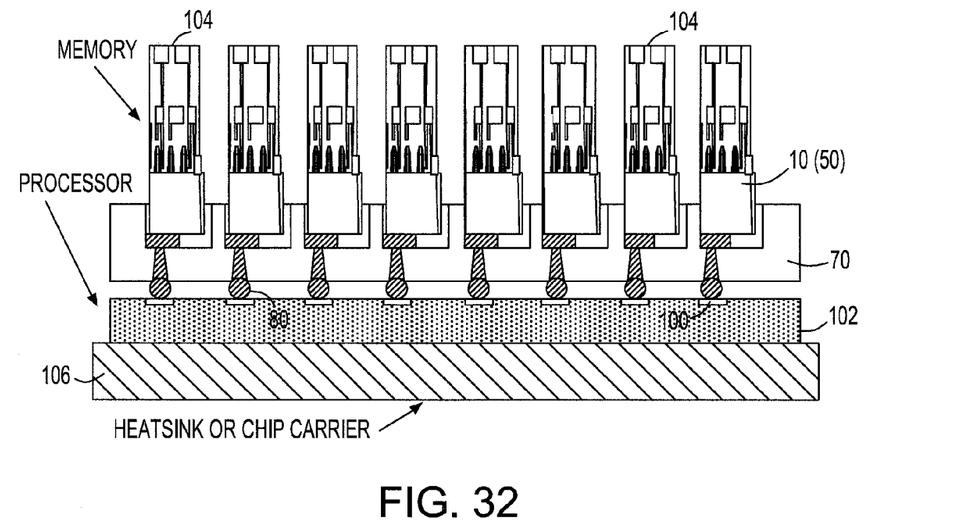
FIG. 32 illustrates a chip carrier which is connected to a microprocessor and with a memory.

As shown in FIG. 32 of the drawings, the carrier 70 may also have the C4 balls 80 connecting to pads 100 located on a processor 102, and the chips 10 or 50 each equipped with a memory 104, with the processor then being supported on a heat sink 106 or directly on the chip carrier. The carrier or the processor may also be equipped with external connections by means of topside C4s or the like.

Figure 33:
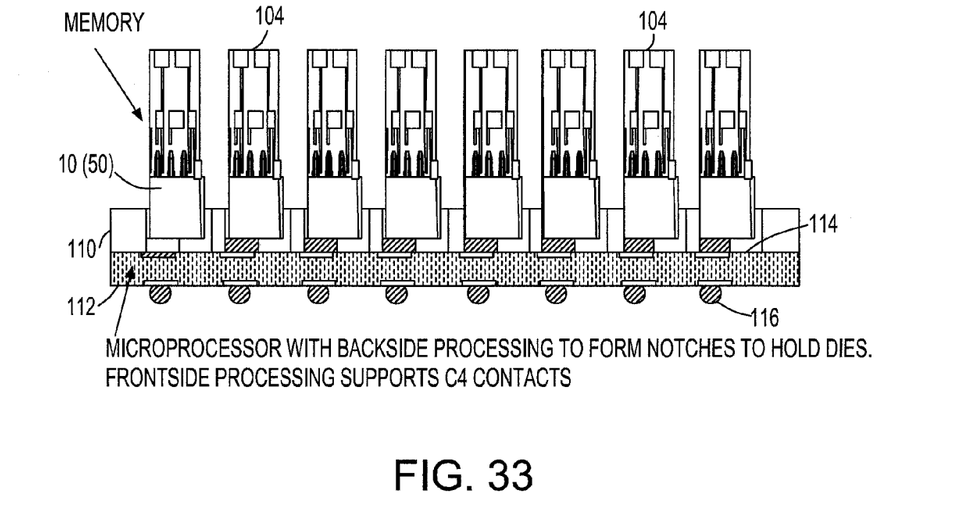
FIG. 33 illustrates a chip carrier with a further microprocessor.

As shown in FIG. 33 of the drawings, the carrier 110 may be equipped with a microprocessor 112 with backside processing in order to form notches 114 for holding dies, whereas the frontside processing enables the support of C4 contacts 116.

Figure 34:
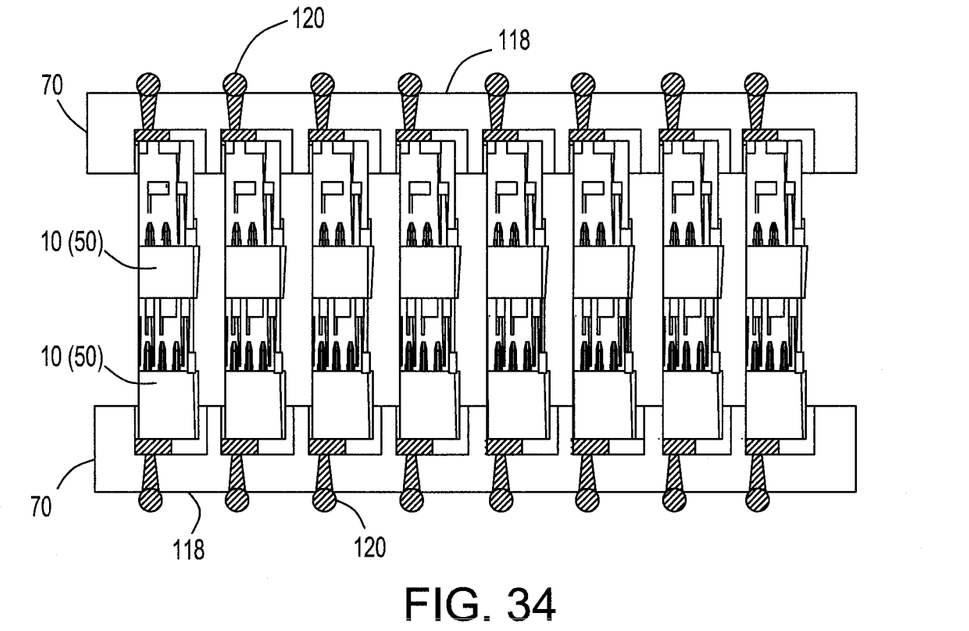
FIG. 34 illustrates a multiple-sided chip carrier.

As shown in FIG. 34 of the drawings, there may be provided paired carriers 70 for the semiconductor chips 10 or 50 in opposed or inverted orientations so as to provide a multi-sided carrier system, wherein the opposite sides 118 have C4 balls 120 attached to form external connections, with the remaining structure being similar to the carrier structure 70 shown in preceding embodiments.

Figure 35:
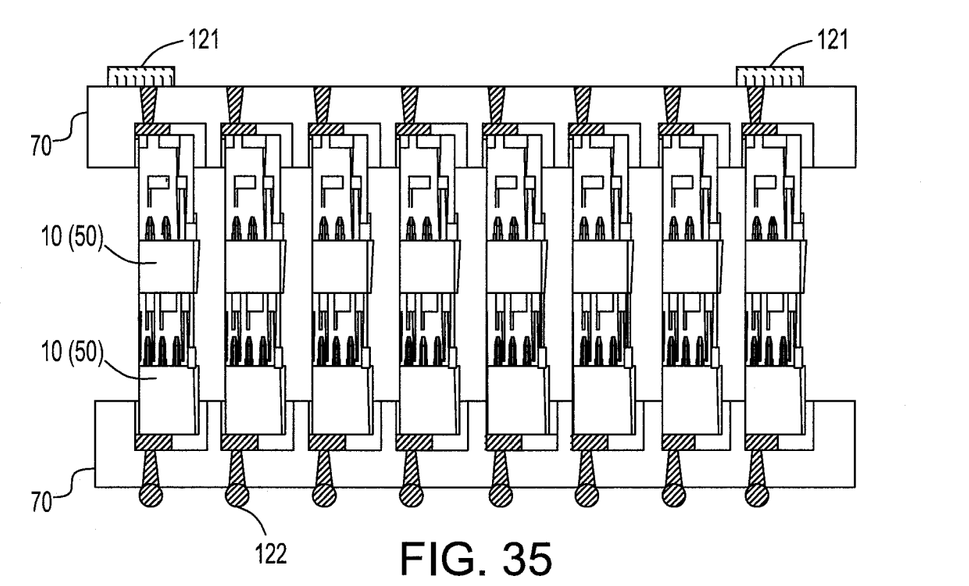
FIG. 35 illustrates an active or passive semiconductor chip carrier for mixed C4s and bonding structure.

As illustrated in FIG. 35 of the drawings, the carriers 70, which are similar to those of FIG. 34, may also be equipped with bonding 121 and C4 ball connections 122, rather than having C4s on opposite sides thereof.

Figure 36:
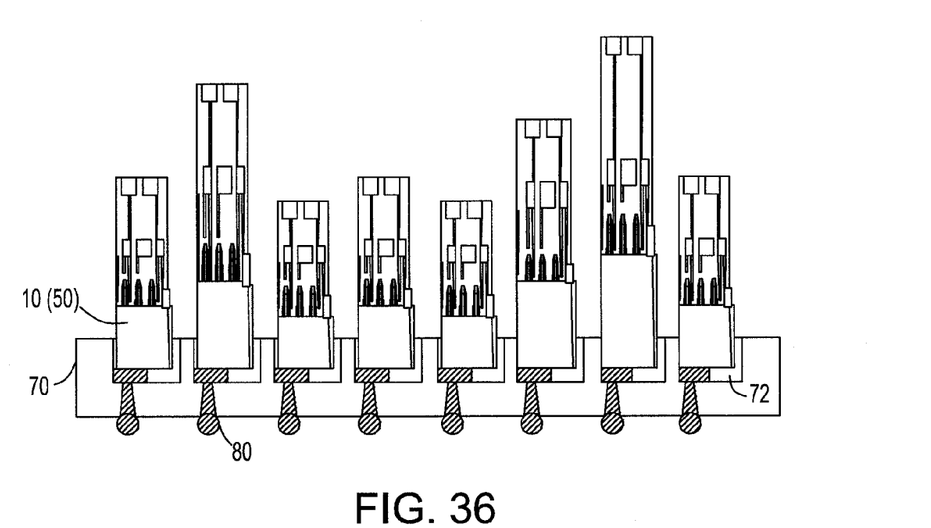
FIG. 36 illustrates a chip carrier supporting chips possessing varying form factors.
Figure 37:
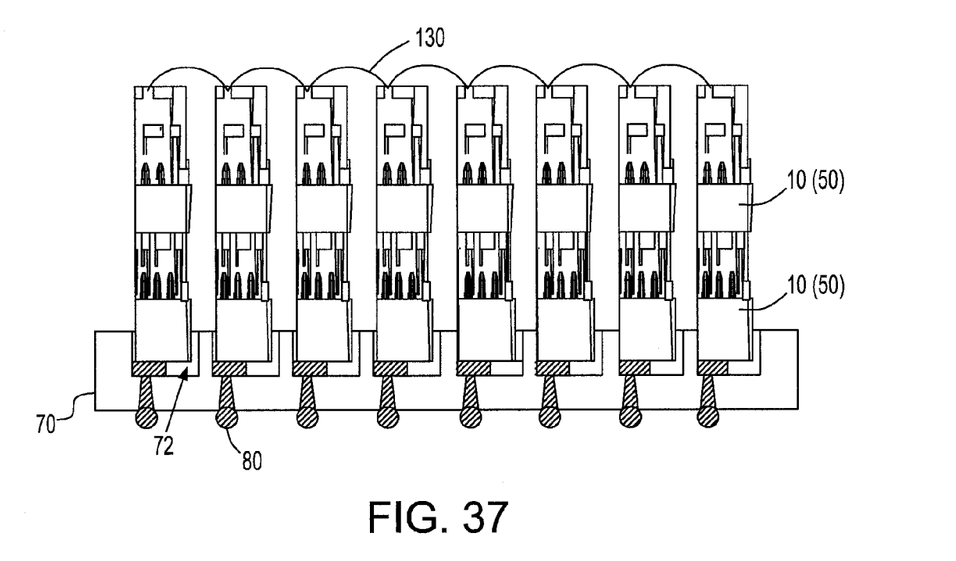
FIG. 37 illustrates an active or passive chip carrier with wire bond interconnects.

As illustrated in FIG. 36 of the drawings, in the carrier 70 the semiconductor chips 10 or 50 may each be of different configurations depending upon the requirements of the respective installation; whereas in FIG. 37 the chip structures may be equipped with wire bond interconnects 130, whereby these can be applied on three (3) exposed sides compared to a multicarrier approach. A material such as epoxy may be provided in the channels or trenches 72 formed in the carrier 70 in order to increase stability at the junctions with the chips.

Figure 38:
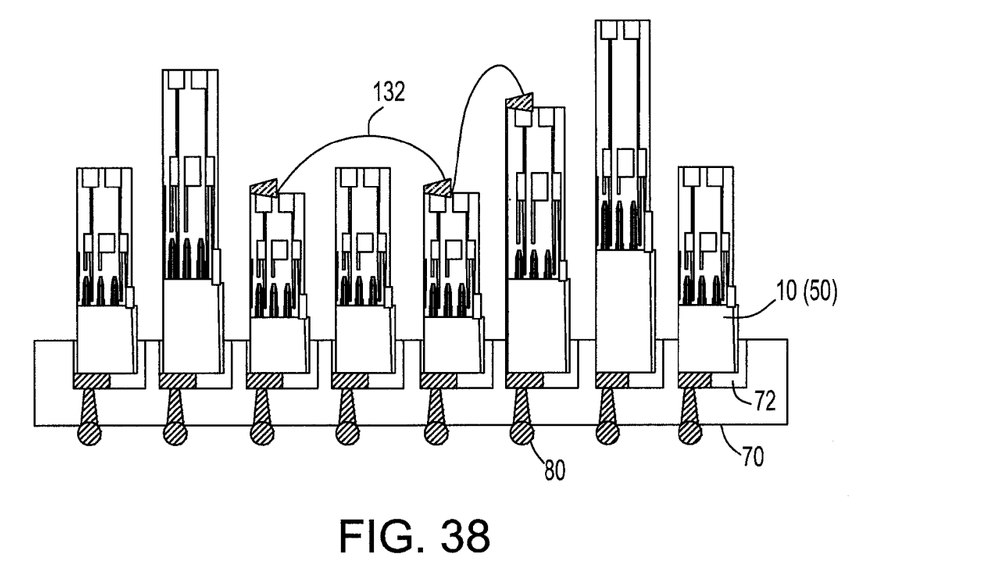
FIG. 38 illustrates a further chip carrier wire bond edge connects.

As shown in FIG. 38, which provides for differently shaped semiconductor chips 10 or 50, wire bond edge connections 132 can be employed to link exposed sides of the overall structure.

Figure 39:
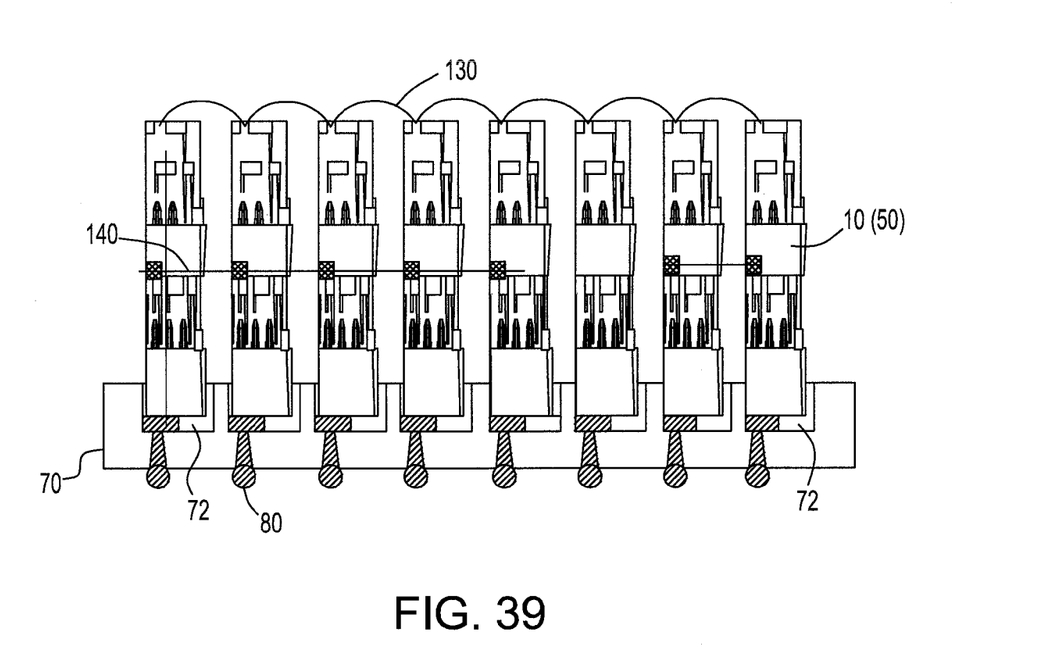
FIG. 39 illustrates either active or passive chip carriers with a through chip interconnect structure.

Finally, as shown in FIG. 39, there may also be provided interconnects whereby there are shown thru-chip vias, solder applied to the chips so that the thru-chip vias are coated with solder, and which have holes in the center thereof, through which a coated or lightly coated wire 140 may be passed and then the structure annealed to reflow the solder in order to complete the electrical connections. The foregoing structure provides a high interconnect density with three-dimensional like connections which do not have to travel or extend through the entire stack thickness, and its best applications may include wires that do not require full stack travel, in providing for memory and secondary bus connections.

From the foregoing, it becomes readily apparent that the present invention provides for unique structures and methods for semiconductor chips and slot interconnects and three-dimensional semiconductor chip stacks, in the provision of chip carriers and operative relationships with semiconductor chips, which is not in any manner disclosed nor suggested in the prior art.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but to fall within the spirit and scope of the appended claims.

What is claimed is:

1. A method of producing a semiconductor chip from a wafer to form electrical edge connections, said method comprising:

providing a substrate having a plurality of electrically interconnected metal levels formed therein;

depositing a protective dielectric material mask layer on an upper surface of said semiconductor chip;

imparting an etching step to said dielectric mask layer so as to form a deep trench extending into said semiconductor chip;

applying a dielectric to the walls of said trench so as to create an electrical isolation layer in said trench;

depositing a temporary sacrificial polysilicon in said trench;

filling any cavities remaining in said trench with an electrically conductive material;

removing said protective dielectric material from said trench;

planarizing said semiconductor chip to remove excess electrically conductive material and form electrical edge connectors;

opening via holes to connect said metal levels and providing wiring to said electrical edge connectors; and thinning said semiconductor chip so as to expose said electrical edge connectors.

2. A method as claimed in claim 1, wherein a plurality of semiconductor chips each having edge connections formed therein are sliced from a wafer.

3. A method as claimed in claim 1, wherein said semiconductor chip is constituted of a silicon material.

4. A method as claimed in claim 1, wherein said electrically conductive material in said deep trench comprises a metal.

5. A method as claimed in claim 4, wherein said semiconductor chip is etched so as to expose said metal in said deep trench and form said electrical edge connections.

6. A method as claimed in claim 1, wherein:

said protective dielectric mask layer is initially deposited on said wafer;

a plurality of said deep trenches are etched into said wafer through said mask layer;

said dielectric isolation layer is formed in said deep trenches to cover the walls thereof; and said electrically conductive material is filled into the remaining spaces of said trenches.

7. A method as claimed in claim 6, wherein a temporary sacrificial polysilicon is deposited in said trenches, said protective dielectric material is removed and said wafer is planarized.

8. A method as claimed in claim 7, wherein:

upper level dielectric material containing metal levels is formed;

a masking layer is applied and etched;

studs of electrical conductive material deposited in said deep trenches to reach edge connectors;

final metal interconnects arranged to connect to edge connectors; and said wafer thinned to bottom of edge connectors, and said edge connectors exposed by etching wafer material prior to dicing into semiconductor chips.

* * * * *